Oct. 28, 1952 C. B. COLEMAN 2,616,066

AUTOMATIC TUNING SYSTEM

Filed March 3, 1951

WITNESSES:
E. A. McCloskey.
Wm. T. Wofford

INVENTOR
Clarence B. Coleman.
BY F. E. Browder
ATTORNEY

Patented Oct. 28, 1952

2,616,066

UNITED STATES PATENT OFFICE 2,616,066

AUTOMATIC TUNING SYSTEM

Clarence B. Coleman, Baltimore, Md., assignor to Westinghouse Electric Corporation, East Pittsburgh, Pa., a corporation of Pennsylvania Application March 3, 1951, Serial No. 213,709

7 Claims. (Cl. 318—28)

Figure 2:
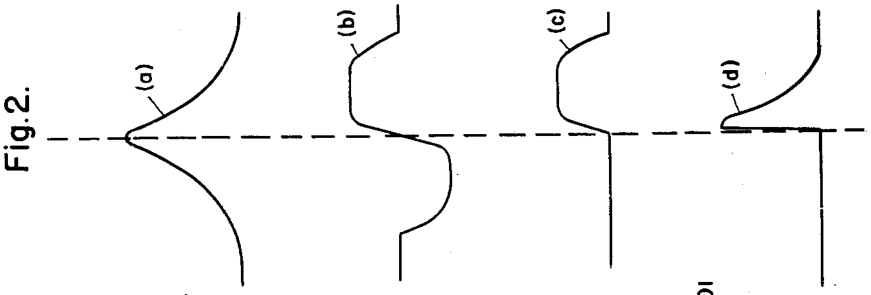

My invention relates to automatic tuning systems, and more particularly to a system for automatically tuning an electrical network to resonance.

Automatic tuning systems as exemplified by the prior art of which I am aware are subject to a number of disadvantages. Such tuning systems generally comprise an electrical network to be tuned to resonance, a motor mechanically coupled to a tuning element of the network, and means responsive to some electrical condition of the network for controlling the motor. Several systems of tuning are designed to stop the tuning motor at resonance by the maximizing of a voltage. Such arrangements provide poor tuning accuracy due to the inertia of the mechanical system. Even though the resonant condition may be anticipated, consistent tuning accuracy is made impossible because the detuning effect of the over-shoot varies with frequency and ambient temperature. Most tuning systems of the amplitude type require an adjustment corresponding to the peak output at resonance. This necessitates provision of some means to automatically adjust sensitivity, since it is not usually possible to obtain exactly the same radio frequency output at resonance over a wide frequency range. Further, many tuning systems require complete scanning by the motor before the actual tuning cycle is started, resulting in low-speed tuning.

It is, accordingly, an object of my invention to provide an automatic tuning system which is simpler and more reliable than the automatic tuning systems of the prior art.

It is another object of my invention to provide an improved automatic tuning system which disturbs to a minimum extent, the radio frequency circuits to which it is applied.

It is another object of my invention to provide an improved automatic tuning system which will require an extremely small amount of input power.

It is another object of my invention to provide an automatic tuning system in which the problem of over-shooting is obviated.

It is a further object of my invention to provide an improved automatic tuning system which will operate satisfactorily over a wide range of frequency outputs.

It is a further object of my invention to provide an improved automatic tuning system which will operate satisfactorily over a wide range of frequencies without necessity for adjustment.

It is a still further object of my invention to provide an improved automatic tuning system in which the tuning is accomplished within a minimum period of time.

In accordance with my invention, a tuning element or elements of the network to be tuned are mechanically coupled to a tuning element adjusting mechanism, which may be a reversible motor. A secondary control circuit is provided for causing the adjusting mechanism to move the tuning element back and forth between its limits when no signal is applied to the network to be tuned. A pulse generating circuit is provided so that when a signal is applied to the network, a control pulse will be generated each time the network is tuned through resonance. The control pulse initiates operation of a primary control circuit. The primary control circuit comprises a memory device which establishes a parameter corresponding to the conditions for resonance at the instant when the control pulse is generated. The primary control circuit further comprises comparison means for controlling the adjusting mechanism. Thus, when the network is tuned through resonance, the control pulse initiates operation of the primary control circuit to establish a parameter corresponding to the conditions for resonance. Immediately thereafter, the comparison means causes reversal of the adjusting mechanism, to tune the network back toward resonance. When the conditions for resonance are again present, as established by the memory device, the comparison means causes the adjusting mechanism to stop. The network is thus tuned to resonance. In a preferred embodiment of my invention where the comparison means comprises a pair of electronic discharge devices, a grid biasing arrangement is used which is such that the only net grid bias applied is that due to the error voltage developed by over-shoot of the adjusting mechanism. This arrangement results in good sensitivity for the system.

Figure 1:
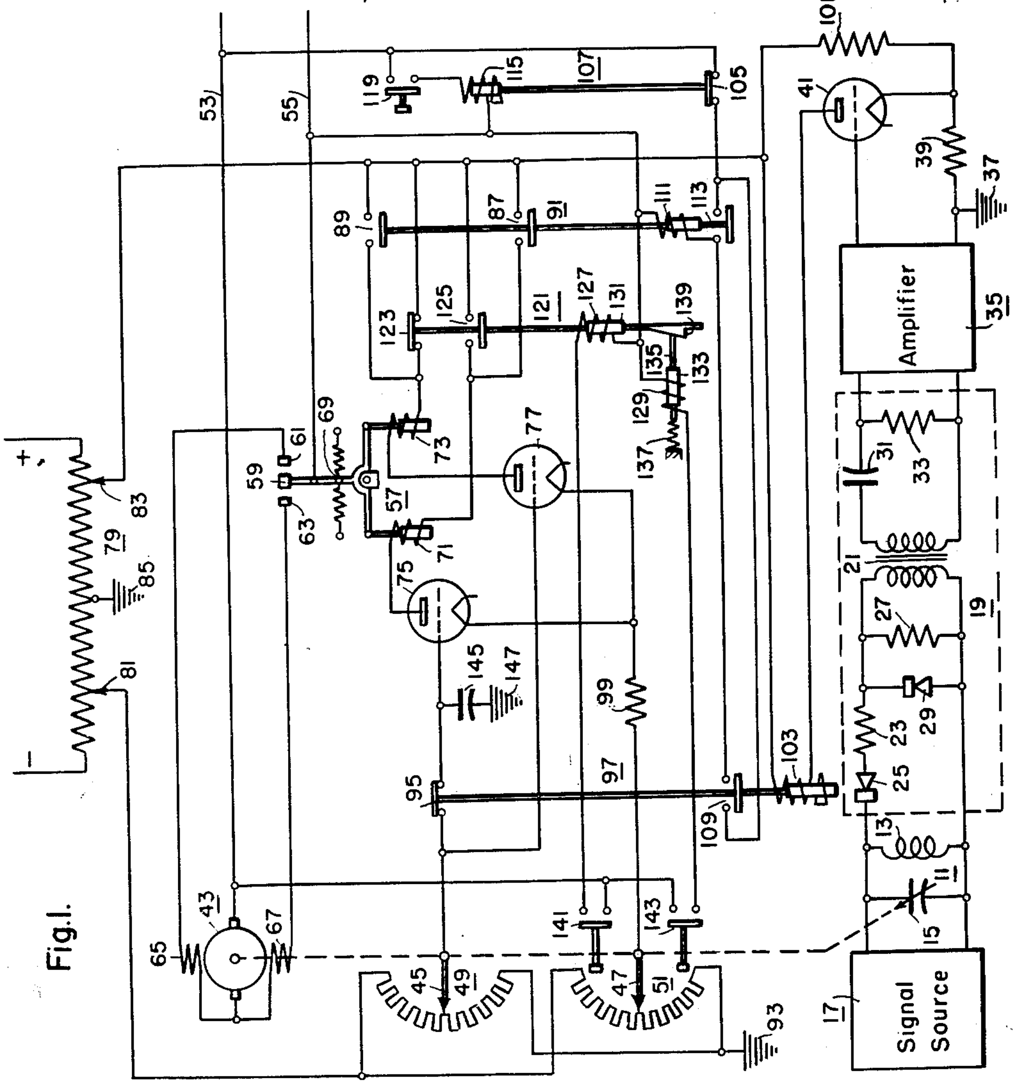

My invention will be best understood and other objects and advantages thereof will appear from the following detailed description taken in connection with the accompanying drawing, in which:

Fig. 1 is a schematic diagram showing a preferred embodiment of my invention, and Fig. 2 is a group of curves to facilitate explanation of the control pulse generating scheme.

Referring now to Fig. 1 of the drawing, there is shown a tunable network 11 comprising an inductance 13 and a capacitor 15 connected in parallel. The tuning element of the network is shown as the variable capacitor 15. A signal source 17 is shown in block form as being connected across the input terminals of the tunable network 11. The signal source may, of course, be a part of any equipment with which it is desired to associate the automatic tuning system of my invention. A pulse generating circuit 19 is shown connected across the terminals of the tunable network 11 so as to obtain a sample of the network voltage. The pulse generating network 19 comprises the primary winding of a coupling transformer 21, a first resistor 23 and a first rectifier 25 connected serially with the input terminals of the pulse generator circuit 19. Shunting the primary winding of the coupling transformer 21 is a second resistor 27 and a second rectifier 29 which is poled like the first rectifier. Also included in the pulse generating circuit is the coupling transformer secondary winding and a capacitor 31 connected serially with the output terminals of the pulse generator 19, and a resistor 33 shunting said output terminals. The output of the pulse generator circuit is connected to the input terminals of a suitable amplifier 35 shown as a block. One output terminal of the amplifier is connected to ground at 37, and through a resistor 39 to the cathode of a control tube 41 having also an anode and a control electrode. The other output terminal of the amplifier is connected to the control electrode of said control tube 41.

The tuning element 15 of the tunable network 11 is mechanically coupled to the shaft of an adjusting device shown schematically as a reversible motor 43. Also coupled mechanically to the tuning element 15 and the shaft of the reversible motor 43 are the movable contacts 45, 47 of a pair of ganged potentiometers 49, 51. These movable contacts are adjusted to be synchronous with each other and with the tuning element 15. The function of the potentiometers 49, 51 will be hereinafter more fully described. Power is supplied to the reversible motor 43 via first and second buses 53, 55 in the conventional manner from a source not shown. A balance relay 57 is utilized to control the rotation of the reversible motor 43. The center contact 59 of the balance relay 57 is connected to the second power supply bus 55 and the right and left contacts 61, 63 are connected to respective windings 65, 67 of the reversible motor 43. The center contact 59 is biased to its neutral position by a pair of springs 69. The balance relay 57 has a pair of energizing windings 71, 73, and unbalanced currents in these windings will cause the center contact 59 to move from its normally neutral position to close a circuit between one or the other of the motor windings 65, 67 to the second power supply bus 55. The operation of the balance relay 57 is controlled by a pair of electronic discharge devices 75, 77 which may be designated for convenience as first and second comparison tubes 75, 77 respectively. These tubes may be triodes of any suitable type. Positive and negative voltages may be obtained from a source shown schematically as a potentiometer 79 having first and second movable contacts 81, 83 and a center-point grounded at 85. The terminals of this potentiometer 79 are connected to a source of direct current power not shown. Positive anode potential is supplied to the comparison tubes 75, 77 from connections which may be traced from the second movable contact 83 of the potentiometer through respective first and second normally open contacts 87, 89 of a primary control relay 91 and respective balance relay energizing windings 71, 73 to the anodes of the respective tubes. The ganged potentiometers 49, 51 are connected in parallel, one of their common terminals being connected to ground at 93 and the other common terminal being connected to the first movable contact 81 of the potentiometer 79. The movable contact 45 of the upper ganged potentiometer 49 is connected to the grid of the second comparison tube 77 and through first normally closed contacts 95 of a start relay 97 to the grid of the first comparison tube 75. The movable contact 47 of the lower ganged potentiometer 51 is connected through a resistor 99 to the cathodes of the comparison tubes 75, 77. Operating potential for the first control tube 41 is established by a resistor 101 which is connected between the cathode of that tube 41 and the second movable contact 83 of the potentiometer 79. The anode of the first control tube 41 is connected through the energizing winding 103 of the start relay 97 to the second movable contact 83 of the potentiometer 79. The start relay 97 is of the slow release type for a purpose to be hereinafter described. A circuit may be traced from the first power supply bus 53 through the normally closed contacts 105 of a reset relay 107, through the second normally open contacts 109 of the start relay 97 and through the energizing winding 111 of the primary control relay 91 to the second power supply bus 55. The second normally open contacts 109 of the start relay 97 are shunted by the third normally open contacts 113 of the primary control relay 91. The reset relay 107 is also of the slow release type for a purpose to be hereinafter explained. The energizing winding 115 of the reset relay 107 is connected in series with a push-button 119 across the power supply buses 53, 55. A secondary control relay 121, of the self-locking type, is also provided. The functions of the various relays mentioned above will be understood from the explanation of the operation of the system, which appears below. The secondary control relay 121 has a pair of back-to-back contacts 123, 125 which are connected respectively in shunt with the first and second normally open contacts 89, 87 of the primary control relay 91. The secondary control relay 121 is shown schematically as having first and second energizing windings 127, 129. The armature 131 of the first energizing winding 127 operates the contacts 123, 125 of the relay. The armature 133 of the second energizing winding 129 operates a plunger 135 which is biased by a spring 137 toward a latch 139 which extends axially from the armature 131 of the first energizing coil 127. When the first energizing coil 127 is energized, its armature is pulled up, closing the first contacts 125 and opening the second contacts 127. The relay 121 is locked in this position by the plunger latch mechanism 135, 139. The second energizing winding 129, when energized, trips the latch so that the second contact 123 is closed and the first contact 125 is open. It is understood that the self-locking relay shown, is purely schematic, and any suitable conventional relay which will perform the required functions, could be used. The energizing windings 127, 129 of the secondary control relay have a common terminal connected to the second power supply bus 55. The other terminal of each winding is connected through the normally open contacts of respective first and second limit switches 141, 143, to the first power supply bus 53. These limit switches 141, 143 are operated by the movable contact 47 of the second ganged potentiometer 51. A capacitor which serves as a memory device and which will be hereinafter termed the memory capacitor 145 is connected between the grid of the first comparison tube 75 and ground at 147.

I will now explain the manner of operation of the automatic tuning system of my invention. Let it be assumed for convenience that when the left contact 63 of the balance relay 57 is closed, the motor 43 will rotate to move the movable contacts of the ganged potentiometers 49, 51 toward ground. Further assume that no signal is supplied initially to the network 11 to be tuned, and that all relays are initially in the position shown. Under these conditions, the motor rotation is controlled by the secondary control relay 121 in cooperation with the limit switches 141, 143. When operating power is supplied to the system, the right energizing winding 73 of the balance relay 57 will be energized and the balance relay will close its right contact 61, and the motor 43 will begin to move the movable contacts of the ganged potentiometers 49, 51 in the direction away from ground 93. The motor will continue in this direction until the movable contact 47 of the lower ganged potentiometer 51 closes the upper limit switch 141. Closing of the upper limit switch energizes the first winding 127 of the secondary control relay 121 to close its first contacts 125 and open its second contacts 123. The first winding 71 of the balance relay 57 will now be energized to close its left contact 63. This will cause the motor 43 to reverse, and begin to move the movable contacts of the ganged potentiometers 49, 51 toward ground 93. When the movable contact 47 of the second ganged potentiometer 51 reaches its ground side limit, the lower limit switch 143 will be closed. Closing of the lower limit switch will energize the second winding 129 of the secondary control relay 121 to trip the latch and cause the second contacts 123 to close and the first contacts 125 to open. The motor 43 will again reverse, and begin to move the movable contacts of the ganged potentiometers 49, 51 away from ground 93. This operation will continue until a signal voltage is applied from the signal source 17 to the tunable network 11.

When a signal is applied to the tunable network 11, the potential at the terminals of the network will vary in magnitude, in the manner shown by curve *a* of Fig. 2, as the network is tuned through resonance. From the waveform shown in curve *a* of Fig. 2, the pulse generator circuit acts to generate a control pulse. With the second rectifier 29 not in the circuit, the magnitude of the potential at the terminals of the secondary winding of the transformer 21 will vary as shown by curve *b* of Fig. 2. With the second rectifier 29 in the circuit, the magnitude of the potential appearing across the terminals of the secondary winding of the transformer 21 will vary as indicated by curve *c* of Fig. 2. The second rectifier 29 prevents negative voltage being applied to the transformer 21. If the second rectifier were not employed, and it was attempted to amplify the waveform of curve *b*, Fig. 2, inaccuracy due to unsymmetrical clipping in the amplifier 35 might result. The waveform shown by curve *c* of Fig. 2 is peaked by the capacitor 31, and the pulse input to the amplifier is as shown by curve *d* of Fig. 2. In the curves of Fig. 2, the ordinates represent voltage, and the abscissas represent frequency.

Attention is now directed to the biasing arrangement for the comparison tubes 75, 77. Dual or ganged potentiometers 49, 51 are employed rather than a single potentiometer because of the limits on the voltage which may be applied to the grids of these tubes. In order to provide good sensitivity, the variation in voltage per unit of movement of the potentiometer movable contact must be high. This means that if the cathodes of the comparison tubes were grounded, it would be necessary to apply a large range of voltages to the grids as the potentiometer movable contact moved between its limits. The use of a pair of ganged potentiometers 49, 51 connected as shown allows the comparison tubes 75, 77 to operate with correct bias throughout the tuning range. Normal operating bias is established in the grid circuits of the comparison tubes 75, 77 by means of the bias resistor connected between their cathodes and the movable contact 47 of the lower ganged potentiometer 51. This bias allows either comparison tube to conduct sufficiently to operate the balance relay when called upon to do so. The only voltage applied between the grids and cathodes of the comparison tubes other than the normal operating bias, is the error voltage developed by the over-shooting of the tuning motor 43. Looking, for example, at the first comparison tube 75, it will be noted that if the movable contact 45 of the upper ganged potentiometer 49 moves away from ground 93, the grid of that tube tends to become more negative. At the same time, however, the movable contact 47 of the lower ganged potentiometer 51 has moved away from ground by a like amount, with the tendency to make the cathode of the first comparison tube more negative with respect to ground. These effects cancel, leaving a net grid-cathode bias change of zero. Now the memory capacitor 145 in the grid circuit of the first comparison tube 75 will, so long as the start relay 97 is deenergized, be charged to a voltage the magnitude of which is related to the position of the movable contacts 45, 47 of the ganged potentiometers 49, 51 at any given instant. This capacitor 145 acts as a memory device. In other words, it remembers what the position of the movable contacts of the ganged potentiometers 49, 51 was at the instant when the start relay 97 was energized. When the start relay is energized, the charging current supply for the memory capacitor is cut off, and a substantially fixed bias between the grid of the first comparison tube 75 and ground is established. From the instant of energization of the start relay 97, the cancelling effect of the ganged potentiometers 49, 51 on the grid-cathode bias is no longer effective with reference to the first comparison tube 75, but is still effective with respect to the second comparison tube 77. With the foregoing explanation of the comparison tube biasing arrangement in mind, explanation of the operation of the system as a whole, may proceed.

Let it be assumed that the movable contacts of the ganged potentiometers 49, 51 are moving away from ground as the tunable network 11 is tuned through resonance. At the instant of resonance, a control pulse such as that shown by curve *d* of Fig. 2 is generated. This control pulse is amplified and applied to the grid of the control tube 41. The control tube is rendered sufficiently conductive to operate the start relay 97 to open its normally closed contacts 95 and close its normally open contacts 109.

The closing of the normally open contacts 109 of the start relay 97 energizes the primary control relay 91. The primary control relay closes its third normally open contacts 113 to lock itself in the energized position. The closing of the first and second normally open contacts 87, 89 of the primary control relay 91 renders operation of the secondary control relay 121 ineffective, so that the first and second comparison tubes 75, 77 can now conduct simultaneously, making it possible for the balanced relay center contact 59 to be moved to its neutral position, under proper conditions. Opening of the normally closed contacts 95 of the start relay 97 cuts off the supply of charging current to the memory capacitor 145. The memory capacitor 145 now establishes a substantially fixed grid to ground bias for the first comparison tube 75 which corresponds to the position of the variable capacitor 15 of the tunable network 11 at the instant of resonance. Now as the variable capacitor 15 is moved on through resonance, and the movable contacts of the ganged potentiometers 49, 51 move further away from ground, the cathode to ground bias of the first comparison tube 75 tends to become more negative, while its grid-to-ground bias remains substantially constant. The net effect of this condition is to make the grid of the first comparison tube 75 more positive with respect to its cathode. This tube will then deliver more current to the first energizing winding 71 of the balance relay 57 and its left contact 63 will now be closed. The motor 43 will then reverse, causing the variable capacitor 15 to be tuned back toward resonance, and the movable contacts of the ganged potentiometers 49, 51 to move back toward ground 93. As the movable contact 47 of the lower ganged potentiometer 51 moves back toward ground, the cathode-to-ground bias on the first comparison tube 75 tends to become more positive. The net grid to cathode bias of the first comparison tube 75 will then become more negative. When the bias on the first comparison tube reaches the original condition for resonance as established by the memory capacitor, the first and second comparison tubes 75, 77 will be conducting equal amounts, and the center contact of the balance relay 57 will be moved to its neutral position. Thus, the motor 43 will be stopped with the variable capacitor 15 of the tunable network 11 in the exact position for resonance.

As heretofore mentioned, the start relay 97 is of the slow release type. This relay once energized remains energized for a period of time sufficient to allow completion of the tuning cycle. Suppose now that the start relay 97 has returned to its non-energized position and that a signal of a different frequency is applied to the tunable network 11. Under these conditions, nothing happens since the primary control relay 91 is still energized, and the comparison tubes 75, 77 continue to conduct equal amounts of current. To cause the system to tune the network 11 to the new frequency, the push button 119 is operated, energizing the reset relay 107. The reset relay then opens its contact 105, causing the primary control relay 91 to be deenergized. The secondary control relay 121 now takes over, and a new tuning cycle is accomplished in the same manner as was hereinbefore described. The reset relay 107 is of the slow release type to insure that the motor 43 will attain the proper speed before the primary control relay 91 can be again energized.

While I have shown and described a specific embodiment, I am aware that many modifications are possible without departing from the scope of my invention. For example, improved sensitivity could be attained by substituting a servo-amplifier and a two-phase motor for the balance relay and the motor shown. I desire, therefore, to be limited only insofar as is necessitated by the prior art and the spirit of the appended claims.

I claim as my invention:

1. An automatic tuning system comprising a primary circuit comprising a network adapted for connection to a source of oscillating energy and tunable to resonance at the frequency of said source, means connected to said network for producing a control pulse at the instant when said network is tuned to resonance, a secondary circuit comprising means for tuning said network through resonance, means to control said tuning means, including a memory device actuable responsive to said control pulse for establishing a parameter corresponding to the condition of resonance of said network, means connected in circuit with said memory device for reversing said tuning means and for stopping said tuning means at the instant when the condition of resonance, as established by said memory device, is again reached.

2. An automatic positioning system comprising an apparatus to be positioned, means for moving said apparatus through its range of positions, means for generating an electric control pulse at the instant when said apparatus is in the desired position, a memory device actuable responsive to said control pulse for establishing a parameter corresponding to the condition for the desired position of said apparatus, means connected in circuit with said memory device for reversing said first mentioned means and for stopping said first mentioned means at the instant when the condition for said desired position, as established by said memory device, is again reached.

3. The invention in accordance with claim 1 wherein said memory device is a capacitor.

4. The invention in accordance with claim 1 wherein said means for producing a control pulse comprises a pulse shaping network connected in circuit with said tunable network.

5. An automatic tuning system comprising a tunable network, tuning means for said network, mechanism for adjusting said tuning means, a pair of grid-controlled electronic discharge devices, means for applying grid bias to said discharge devices, means controlling said mechanism in accordance with the magnitude of conduction of said discharge devices, means connected in circuit with said network for generating a control pulse when said network is tuned to resonance, means responsive to said control pulse for opening the grid bias supply circuit to one of said discharge devices, and a capacitor connected in the grid circuit of said one discharge device to establish a substantially fixed bias component corresponding to the condition of resonance of said network.

6. An automatic tuning system comprising a tunable network, tuning means for said network, a reversible motor for adjusting said tuning means, first and second electronic discharge devices, each having an anode, a cathode and a control electrode, a balance relay having contacts for controlling the rotation of said motor and having an energizing coil connected in the anode circuit of each of said discharge devices, means for applying bias to said control electrodes, means for generating a control pulse when said network is tuned through resonance, means responsive to said control pulse for opening the control electrode bias supply to said first discharge device, and a capacitor connected in the grid circuit of said first discharge device to establish a substantially fixed bias component corresponding to the condition of resonance of said network.

7. An automatic tuning system comprising a tunable network, tuning means for said network, a reversible motor, first and second electronic discharge devices each having an anode, a cathode, and a grid, a balance relay having contacts for controlling rotation of said motor, and having a pair of energizing coils, means connecting each said anode through a respective one of said energizing coils to a positive voltage source, first and second potentiometers connected in parallel, means connecting one common terminal of said potentiometer to a negative voltage source, means connecting the other common terminal of said potentiometers to ground, means connecting the movable contact of said first potentiometer to said grids, means connecting the movable contact of said second potentiometer to said cathodes, a capacitor connected between the grid of said first discharge device and ground, means mechanically coupling the movable contacts of said potentiometers and said tuning means to said motor, means for generating a control pulse when said network is tuned through resonance, and means responsive to said control pulse for opening the connection between the movable contact of said first potentiometer and the grid of said first discharge device.

CLARENCE B. COLEMAN.

REFERENCES CITED

The following references are of record in the file of this patent:

UNITED STATES PATENTS

| Number | Name | Date |
|---|---|---|
| 2,300,742 | Harrison et al. | Nov. 3, 1942 |
| 2,525,442 | Bischoff | Oct. 10, 1950 |
| 2,526,266 | O'Brien | Oct. 17, 1950 |
| 2,537,427 | Seid et al. | Jan. 9, 1951 |